United States Patent
Hausmann et al.

(10) Patent No.: US 7,129,189 B1
(45) Date of Patent: Oct. 31, 2006

(54) ALUMINUM PHOSPHATE INCORPORATION IN SILICA THIN FILMS PRODUCED BY RAPID SURFACE CATALYZED VAPOR DEPOSITION (RVD)

(75) Inventors: Dennis M. Hausmann, Los Gatos, CA (US); Adrianne K. Tipton, Fremont, CA (US); Bunsen Nie, Fremont, CA (US); George D. Papasouliotis, Cupertino, CA (US); Ron Rulkens, Milpitas, CA (US); Raihan M. Tarafdar, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/874,808

(22) Filed: Jun. 22, 2004

(51) Int. Cl.
*H01L 21/31* (2006.01)
*H01L 21/469* (2006.01)

(52) U.S. Cl. .............................. 438/778; 257/E21.576; 438/786

(58) Field of Classification Search ................ 438/778, 438/786; 427/255.19; 257/E21.576
See application file for complete search history.

(56) References Cited

U.S. PATENT DOCUMENTS

| | | | |
|---|---|---|---|
| 5,314,724 A | 5/1994 | Tsukune et al. | |
| 5,525,550 A | 6/1996 | Kato | |
| 5,527,561 A | 6/1996 | Dobson | |
| 5,705,028 A | 1/1998 | Matsumoto | |
| 5,985,770 A | 11/1999 | Sandhu et al. | |
| 6,030,881 A | 2/2000 | Papasouliotis et al. | 438/424 |
| 6,102,993 A | 8/2000 | Bhandari et al. | |
| 6,133,160 A | 10/2000 | Komiyama et al. | |
| 6,184,143 B1 | 2/2001 | Ohashi et al. | |
| 6,300,219 B1 | 10/2001 | Doan et al. | |

(Continued)

FOREIGN PATENT DOCUMENTS

WO    WO02/27063    4/2002

(Continued)

OTHER PUBLICATIONS

U.S. Office Action mailed Dec. 30, 2005, from U.S. Appl. No. 11/026,284.

(Continued)

*Primary Examiner*—Caridad Everhart
(74) *Attorney, Agent, or Firm*—Beyer Weaver & Thomas LLP

(57) ABSTRACT

An method employing atomic layer deposition (ALD) and rapid vapor deposition (RVD) techniques conformally deposits a dielectric material on small features of a substrate surface. The resulting dielectric film applies a phosphate-doped silicate film using atomic layer deposition (ALD) and rapid surface catalyzed vapor deposition (RVD). The method includes the following four principal operations: exposing a substrate surface to an aluminum-containing precursor gas to form a substantially saturated layer of aluminum-containing precursor on the substrate surface; exposing the substrate surface to a phosphate-containing precursor gas to form aluminum phosphate on the substrate surface; exposing the substrate surface to an aluminum-containing precursor gas to form a second substantially saturated layer of aluminum-containing precursor on the substrate surface; and exposing the substrate surface to a silicon-containing precursor gas to form the dielectric film. Generally an inert gas purge is employed between the introduction of reactant gases to remove byproducts and unused reactants. These operations can be repeated to deposit multiple layers of dielectric material until a desired dielectric thickness is achieved.

26 Claims, 2 Drawing Sheets

U.S. PATENT DOCUMENTS

| | | | |
|---|---|---|---|
| 6,316,063 B1 | 11/2001 | Andideh et al. | |
| 6,335,261 B1 | 1/2002 | Natzle et al. | 438/435 |
| 6,352,943 B1 | 3/2002 | Maeda et al. | 502/103 |
| 6,352,953 B1 | 3/2002 | Seki et al. | |
| 6,372,669 B1 | 4/2002 | Sandhu et al. | |
| 6,503,330 B1 | 1/2003 | Sneh et al. | 118/723 |
| 6,511,399 B1 | 1/2003 | McCollum Etchason et al. | 117/102 |
| 6,511,539 B1 | 1/2003 | Raaijmakers | 117/102 |
| 6,531,377 B1 | 3/2003 | Knorr et al. | |
| 6,534,395 B1 | 3/2003 | Werkhoven et al. | |
| 6,534,802 B1 | 3/2003 | Schuegraf | |
| 6,540,838 B1 | 4/2003 | Sneh et al. | 118/715 |
| 6,551,339 B1 | 4/2003 | Gavronsky | 117/102 |
| 6,802,944 B1 | 10/2004 | Ahmad et al. | 204/192.23 |
| 6,861,334 B1 | 3/2005 | Raaijmakers et al. | |
| 6,867,152 B1 | 3/2005 | Hausmann et al. | |
| 6,908,862 B1 | 6/2005 | Li et al. | 438/700 |
| 2001/0049205 A1 | 12/2001 | Sandhu et al. | |
| 2003/0015764 A1 | 1/2003 | Raaijmakers et al. | |
| 2003/0092241 A1 | 5/2003 | Doan et al. | |
| 2003/0129828 A1 | 7/2003 | Cohen et al. | 438/629 |
| 2003/0157781 A1 | 8/2003 | Macneil et al. | |
| 2004/0004247 A1 | 1/2004 | Forbes et al. | |
| 2004/0043149 A1* | 3/2004 | Gordon et al. | 427/255.31 |
| 2004/0044127 A1* | 3/2004 | Okubo et al. | 525/54.3 |
| 2004/0079728 A1 | 4/2004 | Mungekar et al. | 216/67 |
| 2004/0102031 A1* | 5/2004 | Kloster et al. | 438/619 |
| 2004/0206267 A1* | 10/2004 | Sambasivan et al. | 106/15.05 |
| 2005/0054213 A1 | 3/2005 | Derderian et al. | |
| 2005/0112282 A1 | 5/2005 | Gordon et al. | |
| 2005/0239264 A1 | 10/2005 | Jin et al. | 438/424 |

FOREIGN PATENT DOCUMENTS

| | | |
|---|---|---|
| WO | WO03/083167 A1 | 10/2003 |

OTHER PUBLICATIONS

U.S. Office Action mailed Dec. 22, 2005, from U.S. Appl. No. 11/026,563.

Papasouliotis et al., "Metal-Free Catalysts for Pulsed Deposition Layer Process for Conformal Silica Laminates", Novellus Systems, Inc., U.S. Appl. No. 11/318,268, filed Dec. 23, 2005, pp. 1-30.

Cho et al., "Localized Energy Pulse Rapid Thermal Anneal Dielectric Film Densification Method", Novellus Systems, Inc., U.S. Appl. No. 11/327,668, filed Jan. 5, 2006, pp. 1-28.

Papasouliotis et al., "Reactive Seam Healing Methods for Improving Film Integrity In Structures of Confined Geometry", Novellus Systems, Inc., U.S. Appl. No. 11/334,762, filed Jan. 17, 2006, pp. 1-24.

U.S. Office Action mailed Dec. 5, 2005, from U.S. Appl. No. 10/746,274.

Dennis Michael Hausmann, "Atomic Layer Deposition of Metal Oxide Thin Films," A thesis presented by, Harvard University, 186 pages, Jul. 2002.

Hausmann et al., "Rapid Vapor Deposition of Highly Conformal Silica Nanolaminates," Science, vol. 308, Oct. 2002, 5 pages.

Gordon et al., "A Kinetic Model for Step Coverage by Atomic Layer Deposition in Narrow Holes or Trenches", Chemical Vapor Deposition 2003, 9, No. 2, pp. 73-78.

U.S. Office Action mailed May 31, 2005, from U.S. Appl. No. 10/746,274.

Hausmann et al., "Plasma Treatments to Improve the Properties of Silica Thin Films Produced by a Rapid Vapor Deposition (RVD)", Novellus Systems, Inc., filed Dec. 23, 2000, U.S. Appl. No. 10/746,274, pp. 1-29.

Greer et al., "Method and Apparatus to Reduce the Frequency of Chamber Cleans in Rapid Vapor Deposition (RVD) of Silicon Oxide", Novellus Systems, Inc., filed Jul. 12, 2004, U.S. Appl. No. 10/890,376, pp. 1-25.

Hausmann et al., "Silica Thin Films Produced by Rapid Surface Catalyzed Vapor Deposition (RVD) Using a Nucleation Layer", Novellus Systems, Inc., filed Jun. 22, 2004, U.S. Appl. No. 10/875,158, pp. 1-25.

U.S. Office Action mailed Sep. 22, 2005, from U.S. Appl. No. 10/874,814.

Rulkens et al., "Mixed Alkoxy Precursors and Methods of Their Use for Rapid Vapor Deposition of $SiO_2$ Films", Novellus Systems, Inc., filed Jun. 22, 2004, U.S. Appl. No. 10/874,814, pp. 1-26.

Papasouliotis et al., "Method for Controlling Properties of Conformal Silica Nanolaminates Formed by Rapid Vapor Deposition", Novellus Systems, Inc., filed Jun. 22, 2004, U.S. Appl. No. 10/874,696, pp. 1-30.

Gaillard et al., "Silicon dioxide chemical vapor deposition using silane and hydrogen peroxide", Rapid Communications, J. Vac. Sci. Technol. B 14(4), Jul./Aug. 1996, pp. 2767-2769.

Beekmann, et al., "Properties of posttreated low κ flowfill™ films and their stability after etch, resist and polymer strip processes", Microelectronic Engineering 55(2001), pp. 73-79.

Robl et al., "Integration of Flowfill® and Forcefill® for cost effective via applications" Sep. 1999, pp. 77-83.

Penka et al., "Integration Aspects of Flowfill and Spin-on-Glass Process for Sub-0.35 µm Interconnects", pp. 1-3.

Hockele et al., "Flowfill-Process as a New Concept for Inter-Metal-Dielectrics", Siemens AG, Semiconductor Group, 1998, pp. 235-238.

Roland et al., "Theoretical Modeling of $SiO_2$ Photochemical Vapor Deposition and Comparison to Experimental Results for Three Oxidant Chemistries: $SiH_4+O_2$, $H_2O/O_2$, and $H_2O_2$", Chem Mater 2001, 13, 2501-2510.

Roland et al., "Low Temperature Photochemical Vapor Deposition of SiO2 Using 172 nm Xe2* Excimer Lamp Radiation with Three Oxidant Chemistries: $O_2$, $H_2O/O_2$, and $H_2O_2$", Chem Mater 2001, 13, 2493-2500.

Moore et al., "Reaction of hydrogen peroxide with organosilanes under chemical vapour deposition conditions", J. Chem. Soc., Dalton Trans., 2000, 2673-2677.

Gaillard et al., "Effect of plasma and thermal annealing on chemical vapor deposition dielectrics grown using $SIH_4-H_2O_2$ gas mixtures", J. Vac. Sci. Technol. A 15(5), Sep./Oct. 1997, pp. 2478-2484.

Taylor et al., "Studies on the reaction between silane and hydrogen peroxide vapour; surface formation of planarized silica layers", J. Chem. Soc., Dalton Trans., 1997, pp. 1049-1053.

Xia et al., "High Aspect Ratio Trench Filling Using Two-Step Subatmospheric Chemical Vapor Deposited Borophosphosilicated Glass for <0.18 µm Device Application", Journal of The Electrochemical Society, 146 (5) 1884-1888 (1999).

Xia et al., "High Temperature Subatmospheric Chemical Vapor Deposited Undoped Silicated Glass—A Solution for Next Generation Shallow Trench Isolation", Journal of The Electrochemical Society, 146 (3) 1181-1185 (1999).

Arno et al., "Fourier Transform Infrared Characterization of Downstream Gas-Phase Species Generated by Tetraethylorthosilicate/Ozone Atmospheric Pressure Reactions", Journal of The Electrochemical Society, 146 (1) 276-280 (1999).

Romet et al., "Modeling of Silicon Dioxide Chemical Vapor Deposition from Tetraethoxysilane and Ozone", Journal of The Electrochemical Society, 148 (2) G82-G90 (2001).

Ikeda et al., "The Effects of Alkoxy Functional Groups on Atmospheric-Pressure Chemical Vapor Deposition Using Alkoxysilane and Ozone", J. Electrochem. Soc., vol. 142, No. 5, May 1995, pp. 1659-1662.

"Customer A low κ Gapfill Trikon FlowFill vs FHDP", Novellus Systems, Inc., pp. 1-12.

Ritala et al., "Atomic Layer Deposition", Handbook of Thin Films Materials, vol. 1, 2002, pp. 103-159.

Rulkens et al., "Methods for the Use of Alkoxysilanol Precursors for Vapor Deposition of $SiO_2$ Films", Novellus Systems, Inc., filed Dec. 23, 2004, U.S. Appl. No. 11/021,558, pp. 1-24.

Papasouliotis et al., "Dynamic Rapid Vapor Deposition Process for Conformal Silica Laminates", Novellus Systems, Inc., filed Dec. 30, 2004, U.S. Appl. No. 11/027,480, pp. 1-29.

Papasouliotis et al., "Multi-Step Nanolaminate Dielectric Deposition and Etch Back Gap Fill Process", Novellus Systems, Inc., filed Dec. 30, 2004, U.S. Appl. No. 11/026,563, pp. 1-28.

Rulkens et al., "Chamber and Chamber Surface Materials to Inhibit Deposition and Methods of Making Same", Novellus Systems, Inc., filed Dec. 23, 2004, U.S. Appl. No. 11/027,388, pp. 1-26.

Papasouliotis et al., "Methods for Forming High Density, Conformal, Silica Nanolaminate Films Via Pulsed Deposition Layer In Structures of Confined Geometry", Novellus Systems, Inc., filed Dec. 30, 2004, U.S. Appl. No. 11/026,284, pp. 1-24.

U.S. Office Action mailed Oct. 6, 2005, from U.S. Appl. No. 10/975,028.

Tarafdar et al., "Sequential Deposition/Anneal Film Densification Method", Novellus Systems, Inc., filed Oct. 26, 2004, U.S. Appl. No. 10/975,028, pp. 1-34.

Papasouliotis, George D., "Optimal Operation of Conformal Silica Deposition Reactors", Novellus Systems, Inc., U.S. Appl. No. 11/077,198, filed Mar. 9, 2005, pp. 1-32.

Papasouliotis, George D., "Optimal Operation of Conformal Silica Deposition Reactors", Novellus Systems, Inc., U.S. Appl. No. 11/077,108, filed Mar. 9, 2005, pp. 1-31.

Cho et al., "Hydroxyl Bond Removal and Film Densification Method for Oxide Films Using Microwave Post Treatment", Novellus Systems, Inc., Appln. No. Not yet assigned, filed Nov. 15, 2005, pp. 1-27.

U.S. Office Action mailed Nov. 10, 2005, from U.S. Appl. No. 11/021,558.

* cited by examiner

ALUMINUM PHOSPHATE INCORPORATION IN SILICA THIN FILMS PRODUCED BY RAPID SURFACE CATALYZED VAPOR DEPOSITION (RVD)

FIELD OF THE INVENTION

This invention pertains to methods for forming thin dielectric films. More specifically, the invention pertains to methods for applying a phosphate-doped silicate film using atomic layer deposition (ALD) and rapid surface catalyzed vapor deposition (RVD).

BACKGROUND OF THE INVENTION

Conformal, uniform dielectric films have many applications in semiconductor manufacturing. In the fabrication of sub-micron integrated circuits (ICs) several layers of dielectric film are deposited. Two such layers are premetal dielectric (PMD) and interlayer dielectric (ILD). Both of these layers require silicon dioxide films that fill features of various sizes and have uniform film thicknesses across the wafer.

Chemical vapor deposition (CVD) has traditionally been the method of choice for depositing conformal silicon dioxide films. However, as design rules continue to shrink, the aspect ratios (depth to width) of features increase, and traditional CVD techniques can no longer provide adequately conformal films in these high aspect ratio features.

An alternative to CVD is atomic layer deposition (ALD). ALD methods involve self-limiting adsorption of reactant gases and can provide thin, conformal dielectric films within high aspect ratio features. An ALD-based dielectric deposition technique typically involves adsorbing a metal containing precursor onto the substrate surface, then, in a second procedure, introducing a silicon oxide precursor gas. The silicon oxide precursor gas reacts with the adsorbed metal precursor to form a thin film of metal-doped silicon oxide. One drawback, however, to ALD is that the deposition rates are very low. Films produced by ALD are also very thin (i.e., about one monolayer); therefore, numerous ALD cycles must be repeated to adequately fill a gap feature. These processes are unacceptably slow in some applications in the manufacturing environment.

A related technique, referred to as rapid vapor deposition (RVD) processing, is another alternative. RVD is similar to ALD in that reactant gases are introduced alternately over the substrate surface, but in RVD the silicon oxide film can grow more thickly. Thus, RVD methods allow for rapid film growth similar to using CVD methods but with the film conformality of ALD methods.

In the previously mentioned dielectric film applications, it is often desirable dope the silicate film with phosphorous, which acts as a sodium-gettering species. However, there is no known previously described process for RVD of phosphorous doped silica films.

What is therefore needed are methods for producing phosphorous-doped silica films using RVD.

SUMMARY OF THE INVENTION

The present invention provides a method for using ALD and RVD techniques to produce a phosphorous-doped dielectric film. This method involves four principle operations: 1) exposing a substrate surface to an aluminum-containing precursor gas to form a substantially saturated layer of aluminum-containing precursor on the substrate surface, 2) exposing the substrate surface to a phosphate-containing precursor gas to form aluminum phosphate on the substrate surface, 3) exposing the substrate surface to an aluminum-containing precursor gas to form a second substantially saturated layer of aluminum-containing precursor on the substrate surface and 4) exposing the substrate surface to a silicon-containing precursor gas to form the dielectric film. In variations of the invention, operations 1) and 2) are repeated a number of times prior to operation 3). In some embodiments operations 1) and 2) are repeated a total of 2–5 times prior to operation 3), for example. Operations 1)–4) are repeated until a desired dielectric thickness is obtained. Operations 1)–2) may be repeated a plurality of cycles prior to operations 3) and 4) in at least some of the operation 1)–4) cycles. In preferred embodiments, each of 1)–4) is followed by a reactor purge. Alternately, any suitable metal-containing precursor that can sufficiently adsorb onto the substrate surface and sufficiently react with the subsequently added silicon-containing precursor to form a dielectric layer that is more than a monolayer thick may be used in place of the aluminum-containing precursor. Other metal-containing precursors that can be deposited to reactivate the catalytic surface include, but are not limited to, zirconium, hafnium, gallium, titanium, niobium, tantalum, and their oxides or nitrides.

Various process precursors may be used in preferred embodiments of the invention. For example, the aluminum-containing precursor can be hexakis(dimethylamino) aluminum or trimethyl aluminum. Flow rates of aluminum-containing precursor gas can range broadly, e.g., between about 1 and 10000 sccm. Preferred flow rates of aluminum-containing precursor gas range between about 1 and 100 sccm.

The phosphate-containing precursor may be one of any number of precursors having a general formula of the form:

where $a \in \{0, 1\}$ $b \in \{1, 2, 3\}$ b+c=3

R=alkyl or aromatic substitutent.

for example, di(iso-propyl)phosphate. Flow rates of phosphate-containing precursor gas can range broadly e.g., between about 1 and 10000 sccm. Preferred flow rates of aluminum-containing precursor gas range between about 100 and 400 sccm.

The silicon containing precursor can be a silanol, such as tris(tert-butoxy)silanol (((C4H9O)3SiOH) or tris(tert-pentoxy)silanol((C5H11O)3SiOH), or a silanediol, such as di(tert-butoxy)silandiol. Preferred flow rates for the silicon-containing precursor range between about 200 to 1000 sccm.

In preferred embodiments of the invention, the substrate is a partially fabricated semiconductor wafer. Further, the wafer may include shallow trench isolation (STI) features, premetal dielectric (PMD) and/or interlayer dielectric (ILD) features over which the dielectric film is to be deposited.

Exposure to the aluminum-containing precursor and the silicon-containing precursor may occur in different chambers in preferred embodiments of the invention. Further, additional precursor gases may be used.

DETAILED DESCRIPTION

Figure 1:
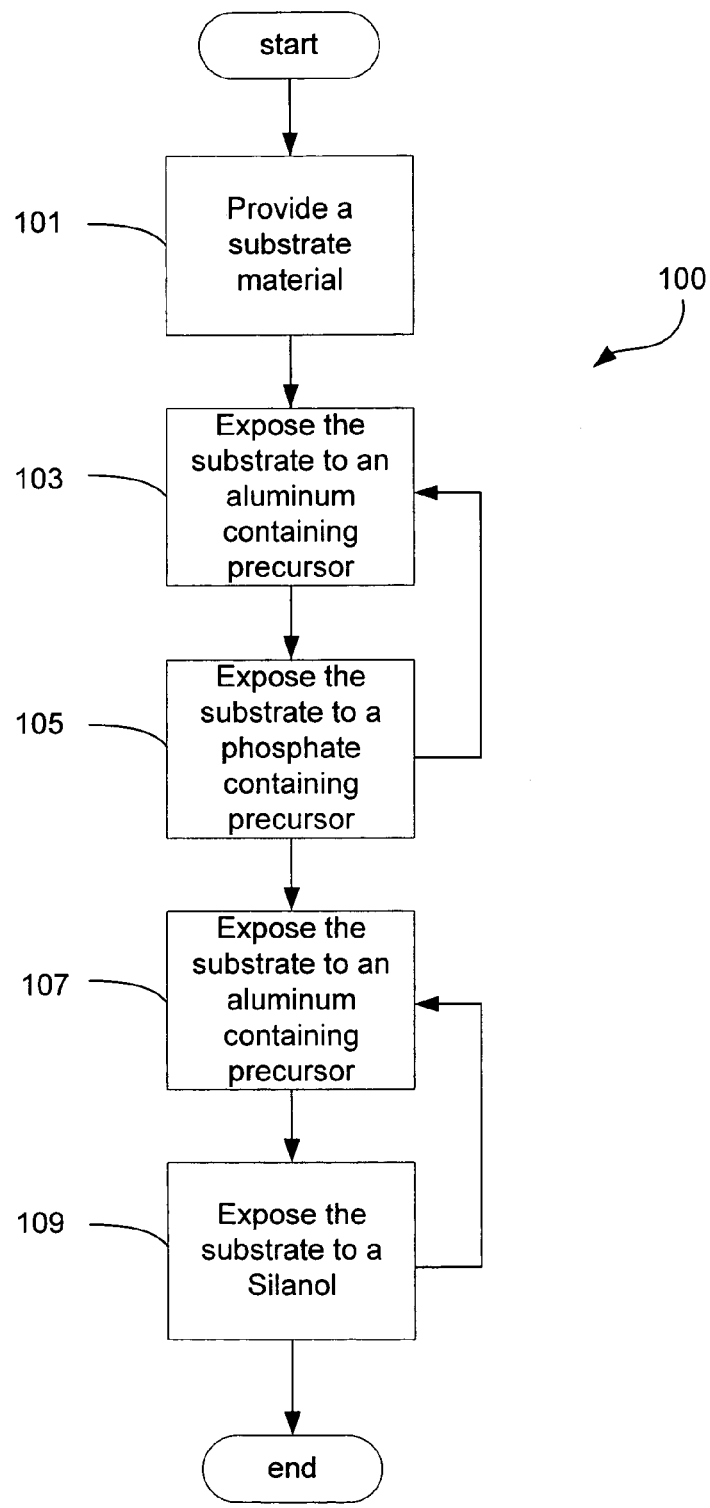
FIG. 1 is a process flow diagram illustrating relevant operations in an atomic layer deposition (ALD) and rapid vapor deposition (RVD) process to form a low-k dielectric film in accordance with the present invention.

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

As indicated, the present invention provides a method for using ALD and RVD techniques to produce a phosphorous-doped dielectric film. The methods employ an ALD deposition of a phosphate layer and RVD techniques to deposit a bulk silica layer on top of the phosphate layer.

Generally, a RVD method involves sequentially depositing a plurality of atomic-scale films on a substrate surface by sequentially exposing and removing reactants to and from the substrate surface. An exemplary case of RVD using reactant gases A and B will now be used to illustrate principle operations of a RVD process in accordance with the present invention. First, gas A is injected into a chamber and the molecules of gas A are chemically or physically adsorbed to the surface of a substrate, thereby forming a "saturated layer" of A. Formation of a saturated layer is self-limiting in nature and represents a thermodynamically distinct state of adsorbed A on a surface. In some cases, a saturated layer is only one monolayer. In other cases, a saturated layer is a fraction of a monolayer, or some multiple of monolayers.

After a saturated layer of A is formed, typically, the remaining gas A in the chamber is purged using an inert gas. Thereafter, the gas B is injected so that it comes in contact with the adsorbed layer of A and reacts to form a reaction product of A and B. Because the saturated layer of A is nominally thin and evenly distributed over the substrate surface, excellent film step coverage can be obtained. B is flowed over the substrate for a period of time sufficient to allow the reaction between A and B to preferably go to completion; i.e., all of the adsorbed A is consumed in the reaction. In a RVD process, B is flowed over the substrate for a period of time sufficient for B to accumulate to thicknesses in excess of one monolayer. After a desired film thickness is achieved, the flow of B is stopped and the reaction is halted. At this point, residual gas B and any byproducts of the reaction are purged from the chamber. Further RVD cycles of substrate exposure to A, followed by exposure to B, can be implemented and repeated as needed for multiple layers of material to be deposited.

RVD methods are related to the well-established chemical vapor deposition (CVD) techniques. However, in CVD, the chemical reactant gases are simultaneously introduced in a reaction chamber and allowed to mix and chemically react with each other in gas phase. The products of the mixed gases are then deposited on the substrate surface. Thus, RVD methods differ from CVD since in RVD the chemical reactant gases are individually injected into a reaction chamber and not allowed to mix prior to contacting the substrate surface. That is, RVD is based on separated surface-controlled reactions.

Another deposition technique related to RVD is atomic layer deposition (ALD). RVD and ALD are both surface-controlled reactions involving alternately directing the reactants over a substrate surface. Conventional ALD, however, depends on self-limiting typically monolayer producing reactions for both reactant gases. As an example, if reactants C and D are first and second reactant gases for an ALD process, after C is adsorbed onto the substrate surface to form a saturated layer, D is introduced and reacts only with adsorbed C. In this manner, a very thin and conformal film can be deposited. In RVD, as previously described using exemplary reactants A and B, after A is adsorbed onto the substrate surface, B reacts with adsorbed A and is further able to react to accumulate a self-limiting, but much thicker than one monolayer film. Thus, as stated previously, the RVD process allows for rapid film growth similar to using CVD methods but with the conformality of ALD type methods. In the present invention, this further accumulation of film is accomplished by a catalytic polymerization, which will be discussed in detail further.

The differences between conventional ALD and RVD film formation are principally due to the difference between the thicknesses of the films formed after the completion of each type of process. In the present invention, an ALD process is used to form an aluminum phosphate layer. More specifically, a layer of $Al_2(PO_4)_3$ is formed by alternately exposing the substrate to an aluminum-containing precursor and a phosphorous containing precursor. This aluminum phosphate layer acts as a getterer, i.e., a layer to isolate undesirable mobile ions, for example sodium or potassium ions, to prevent them from traveling freely throughout the substrate. In general, about in general about 5% P by weight is effective for gettering.

FIG. 1 is a process flow diagram illustrating relevant operations in an atomic layer deposition (ALD) and rapid vapor deposition (RVD) process to form a low-k dielectric in accordance with the present invention.

The deposition process 100 begins with operation 101, wherein a substrate is placed into a deposition chamber. For many embodiments of the invention, the substrate is a semiconductor wafer. A "semiconductor wafer" as discussed in this document is a semiconductor substrate at any of the various states of manufacture/fabrication in the production of integrated circuits. As mentioned previously, two commercially important applications of the present invention are premetal dielectric (PMD) and interlayer dielectric (ILD). These layers are typically phosphorous-doped to prevent migration of ions through the layer.

The process continues with operation 103, where an aluminum-containing precursor gas is pumped into the deposition chamber so as to substantially saturate the surface with the aluminum containing precursor. Any suitable aluminum-containing precursor that can sufficiently adsorb onto the substrate surface and sufficiently react with the subsequently added silicon-containing precursor may be used. In addition, the aluminum-containing precursor should be capable of aiding the catalytic polymerization of the subsequently added silicon-containing precursor to produce a film thicker than a monolayer. In preferred embodiments, for example, hexakis(dimethylamino)aluminum $(Al_2(N(CH_3)_2)_6)$ or trimethylaluminum $(Al(CH_3)_3)$ are used. Other suitable aluminum-containing precursors include, for example, triethylaluminum (Al(CH$_2$CH$_3$)$_3$) or aluminum trichloride (AlCl$_3$).

Note that any suitable metal containing precursor that can sufficiently adsorb onto the substrate surface and sufficiently react with the subsequently added silicon-containing precursor to form a dielectric layer that is more than a monolayer thick may be used in place of the aluminum-containing precursor. Other metal-containing precursors that can be deposited to reactivate the catalytic surface include, but are not limited to, zirconium, hafnium, gallium, titanium, niobium, tantalum, and their oxides or nitrides.

As indicated earlier, forming a saturated layer is a self-limiting process and to a certain extent independent of process conditions. Relevant process conditions can include pressure, precursor flow rate, substrate temperature, and dose. Pressures can range broadly, e.g., between about 1 mTorr and 760 Torr. Typical pressures range between about 100 and 750 mTorr and typical temperatures range between about 200 and 300 degrees Celsius. Flow rates of aluminum-containing precursor gas can range broadly, e.g., between about 1 and 10000 sccm. Preferred flow rates of aluminum-containing precursor gas range between about 1 and 100 sccm. The dose of aluminum-containing precursor can range broadly, e.g., between about 0.001 milligrams and 10 grams. Typical aluminum-containing precursor doses range between about 0.01 and 0.02 grams. Exposure times suitable for forming a saturated layer are typically only seconds. In some embodiments, for example, an exposure time of about 2 seconds is found to be sufficient.

Returning to FIG. 1, after a saturated layer of aluminum-containing precursor is formed, an inert gas is preferably used to purge the substrate surface and reaction chamber (not shown). It should be noted that introduction of a purge gas can be used in between operations wherein contact between reactant gases should be avoided, including between each ALD and RVD operation. Further, the purge gas can be flowed continuously during any of these operations and a period or periods between the operations. Purge gases are generally inert. Acceptable purge gasses are generally inert, that is, they are not generally reactive toward the substrate, process gasses, or reactor surfaces at the pressure and temperature of operation. Examples include argon and nitrogen. The reaction chamber may additionally be evacuated following inert gas purge.

Next, in operation 105, a phosphorous-containing gas such as, for example, di(iso-propyl)phosphate is introduced into the chamber such that it forms a substantially saturated layer over the substrate. Other phosphorous containing precursor gases, such as bis(isopropyl)phosphate or bis(tertbutyl)phosphate may be used as well. Generally, gases of the form O$_a$P(OR)$_b$(OH)$_c$, where a is 0 or 1, b is 1, 2, or 3 and b+c=3, are suitable precursors. Further, R may be either an alkyl or aromatic substituent. The formula may be also expressed in using set nomenclature: O$_a$P(OR)$_b$(OH)$_c$ a $\epsilon\{0, 1\}$ b $\epsilon\{1, 2, 3\}$ b+c=3, where R=alkyl or aromatic substitutent.

Suitable temperatures range from about 150 to 350; suitable pressures range from about 0.10 torr to 10.0 torr; suitable dose ranges from about 10.0 mg to 1.0 g; and suitable time ranges from about 1.0 sec to 1.0 min. Operations 103 and 105 are repeated until a desired thickness of aluminum phosphate has been reached. Each cycle typically has a growth rate of 1–2 Angstroms per cycle. In a preferred embodiment, 2–5 cycles are performed.

Next, after purging the chamber, the RVD portion of process 100 begins with step 107 where, once again, an aluminum-containing precursor gas is pumped into the deposition chamber so as to substantially saturate the surface with the aluminum containing precursor. As is the case with respect to operation 103, any suitable aluminum-containing precursor that can sufficiently adsorb onto the substrate surface and sufficiently react with the subsequently added silicon-containing precursor may be used Next, after the chamber is again purged, the RVD portion of process 100 continues with the exposure of the substrate to a silicon-containing precursor gas under conditions suitable for the growth of a dielectric film in operation 107. Any suitable silicon-containing precursor that can sufficiently adsorb onto and react with the saturated layer of aluminum-containing precursor to form a dielectric film may be used. In addition, the silicon-containing precursor should be capable of polymerization when exposed to the adsorbed aluminum-containing precursor to produce a film thicker than a monolayer. Preferred silicon-containing precursors include silanols and silanediols, such as alkoxysilanols, alkyl alkoxysilanols, alkyl alkoxysilanediols and alkoxysilanediols. Examples of suitable precursors include tris(tert-butoxy)silanol ((C$_4$H$_9$O)$_3$SiOH), tris(tert-pentoxy)silanol ((C$_5$H$_{11}$O)$_3$SiOH), di(tert-butoxy)silandiol ((C$_4$H$_9$O)$_2$Si(OH)$_2$) and methyl di(tert-pentoxy)silanol.

While the invention is not limited to this theory of operation, as mentioned previously, it is believed that the accumulation of dielectric film is achieved via a polymerization process. The saturated layer of aluminum precursor can catalytically polymerize the silicon-containing precursor to produce growing chains of silica. After a period of growth determined by the substrate temperature, the silica polymer can "gel" or "cross-link" to form a solid silicon dioxide. The final film thickness depends on the silicon dioxide layer formation rate and the amount of time the silicon containing precursor is exposed to the saturated layer of aluminum atoms. The film can also be made thicker by repeating the number of precursor deposition cycles. Studies regarding these finding can be found in the doctoral thesis of Dennis Hausmann, Harvard University, (2002).

Process parameters during exposure to the silicon-containing precursor including temperature, gas pressure, flow rate, dose and exposure times will vary depending on the types of precursors used, reaction chamber configuration and desired final film thickness, deposition rate and dielectric characteristics, among other variables. Temperatures can range from about 200 to 300° C. A typical deposition temperature is about 250° C. Pressures can range broadly, e.g., between about 1 mTorr and 760 Torr. Typical pressures range between about 500 and 2000 mTorr. Flow rates of silicon-containing precursor gas can range broadly, e.g., between about 1 and 10000 sccm. Preferred flow rates of silicon-containing precursor gas range between about 200 and 1000 sccm. The dose of silicon-containing precursor can range broadly, e.g., between about 0.001 milligrams and 100 grams. Typical silicon-containing precursor doses range between about 0.1 and 0.3 grams. Exposure times can range broadly, e.g., between about 1 milliseconds and 100 seconds. Preferred exposure times typically range between about 1 and 10 seconds. The number of separate exposures to silicon-containing precursor will primarily depend upon the desired final film thickness.

Referring back to FIG. 1, after exposure to a silicon-containing precursor and formation of a dielectric film, if the dielectric film is not yet of desired thickness, subsequent cycles of the RVD process can be repeated until a desired thickness is achieved. See operations 107 through 109 of FIG. 1. In variations of the invention, operations 103 and 105 are repeated a number of times, for example a total of 1–3 times, prior to operation 107. Operations 103–109 are repeated until a desired dielectric thickness is obtained. Operations 103–105 may be repeated a plurality of cycles prior to operations 107 and 109 in at least some of the operation 103–109 cycles. In preferred embodiments, each of 103–109 is followed by a reactor purge.

This is followed by operation 111, wherein the substrate surface is exposed to an aluminum-containing precursor gas. Operations 107 and 109 are repeated until a desired thickness of dielectric material has been built up. Typically, each RVD cycle deposits about 150 Angstroms of material. The process generally concludes with silicon-containing precursor gas exposure.

OTHER EMBODIMENTS

Other deposition co-reactants, such as an oxygen-containing oxidant (e.g. water, $H_2O_2$, $O_3$, etc.), may be used in the ALD operation as well. See for example, U.S. patent application Ser. No. 10/875,158, titled "Silica Thin Films Produced By Rapid Surface Catalyzed Vapor Deposition (RVD) Using A Nucleation Layer", which is concurrently filed with the present application and incorporated by reference in its entirety for all purposes. Additionally, during the silica deposition, silanols with varying substituents (i.e. more than one kind of alkoxy substituent) may be used to improve the film characteristics. For an example, see U.S. patent application Ser. No. 10/874,814, titled "Mixed Alkoxy Precursors and Methods of Their Use for Rapid Vapor Deposition of $SiO_2$ Films", which is also concurrently filed with the present application and incorporated by reference in its entirety for all purposes. Furthermore, various post-deposition treatments (e.g., thermal annealing or plasma treatments) may be used to improve film characteristics (e.g., densifying the film by removing water as well. For example, see U.S. patent application Ser. Nos. 10/672,309, titled "Properties Of A Silica Thin Film Produced By A Rapid Vapor Deposition [RVD] Process", filed on Sep. 26, 2003, Ser. No. 10/746,274, titled "Plasma Treatments To Improve The Properties Of Silica Thin Films Produced By A Rapid Vapor Deposition (RVD), filed on Dec. 23, 2003, and Ser. No. 10/874,696, titled "Method For Controlling Properties Of Conformal Silica Nanolaminates Formed By Pulsed Layer Deposition", concurrently filed with the present application, which are hereby incorporated by reference in their entirety for all purposes.

RVD Apparatus

Figure 2:
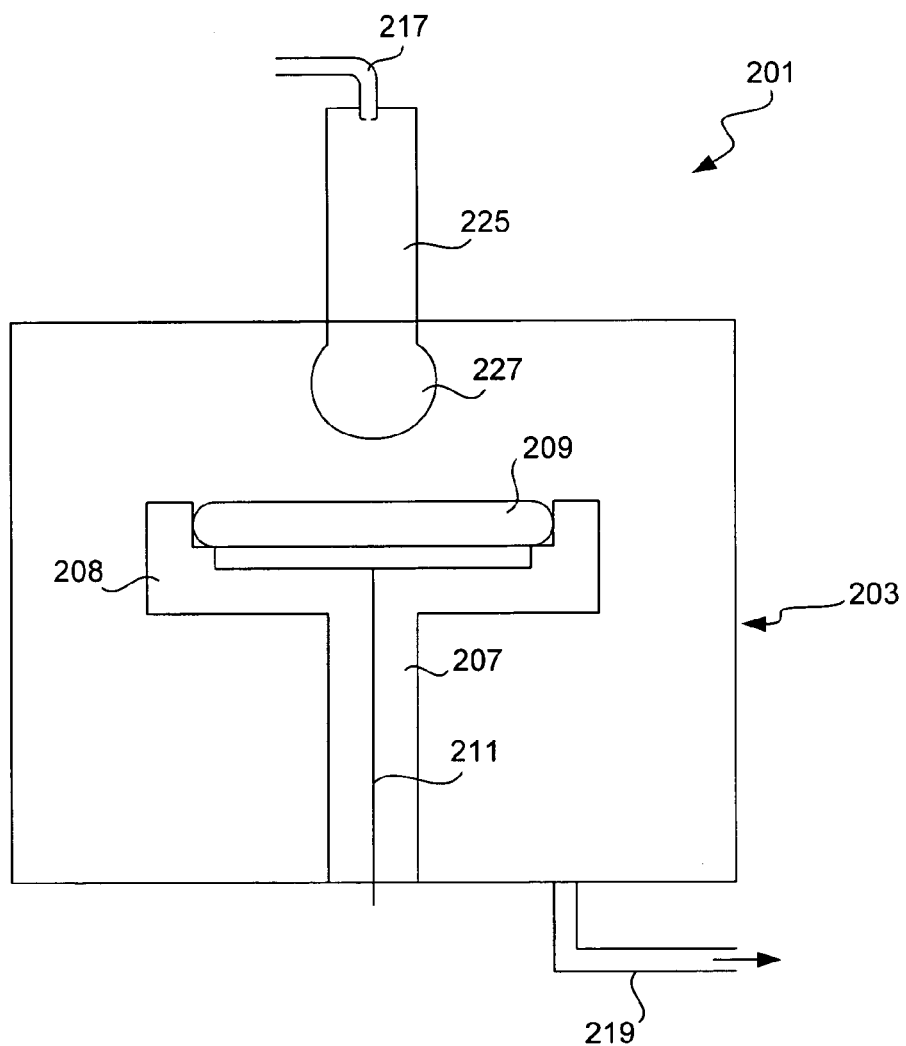
FIG. 2 is a schematic diagram showing the basic features of a RVD reactor suitable for practicing the current invention.

FIG. 2 is a block diagram depicting some components of a suitable dual source RF/microwave plasma reactor for performing a RVD process in accordance with this invention. Note that this apparatus is only an example of suitable apparatus for RVD processes in accordance with the present invention. Many other apparatuses and systems, including a multi-chambered apparatus, may be used.

As shown, a reactor 201 includes a process chamber 203, which encloses components of the reactor and serves to contain the reactant gases and provide and area to introduce the reactant gases to substrate 209. The chamber walls may be made of or plated with any suitable material, generally a metal that is compatible with the deposition and associated processes conducted therein. In one example, the process chamber walls are made from aluminum. Within the process chamber, a wafer pedestal 207 supports a substrate 209. The pedestal 207 typically includes a chuck 208 to hold the substrate in place during the deposition reaction. The chuck 208 may be an electrostatic chuck, a mechanical chuck or various other types of chuck as are available for use in the industry and/or research.

A heat transfer subsystem including lines 211 for supplying a heat transfer fluid to the pedestal 207 controls the temperature of pedestal 207. In some embodiments, the heat transfer fluid comprises water or another liquid. The reactant gases, as well as inert gases during purge, are introduced individually into the reactor at tube 225 via inlet 217. A showerhead 227 may be used to distribute the gas flow uniformly in the process reactor. Reactant gases are introduced through a gas supply inlet mechanism including orifices. There may be multiple reactant gas tubes and inlets. A vacuum pump (e.g., a turbomolecular pump) connected to outlet 219 can draw out gases between RVD cycles.

Various details of the apparatus have been omitted for clarity's sake and various design alternatives may be implemented.

EXAMPLES

The following prospective example provides details concerning the implementation of an embodiment of the present invention. It should be understood the following is representative only, and that the invention is not limited by the detail set forth in this example.

A single layer of $Al_2(PO_4)_3$ is deposited over a high aspect ratio feature (trench) on a substrate using ALD by placing a substrate material (i.e. a silicon wafer), in a reaction chamber and then exposing the substrate to tri-methyl-aluminum for one second. This is followed by a five-second reactor purge, wherein an inert gas is introduced into the reaction chamber. Next, the substrate is exposed to a phosphate precursor by opening a valve separating a container with phosphate precursor vapor at 10 Torr and 150° C. for one second. The process is repeated as necessary until a desired thickness has been reached. Next, the RVD silica deposition process begins by opening a valve separating a chamber with trimethylaluminum the chamber by at 1 Torr and 230° C. for 1 second. After a 5 second reactor purge, the silicon-containing precursor is introduced into the reaction chamber by opening a valve containing tris(tert-pentoxy)silanol at 1 Torr and 230 C.

The RVD steps are repeated until a desired thickness of dielectric material has been reached. Alternately, the ALD steps are repeated at the beginning of one ore more of the RVD.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. For example, while the invention has been described primarily in terms of preparing integrated circuits, it is not so limited. Accordingly, the present embodiments are to be considered as illustrative and not restrictive, and the invention is not to be limited to the details given herein, but may be modified within the scope and equivalents of the appended claims.

The entire disclosures of all references cited herein are incorporated by reference for all purposes.

The invention claimed is:

1. A method of forming a dielectric film, the method comprising:
   (a) exposing a substrate surface to an aluminum-containing precursor gas to form a substantially saturated layer of aluminum-containing precursor on the substrate surface;
   (b) exposing the substrate surface to a phosphate-containing precursor gas to form aluminum phosphate on the substrate surface;
   (c) exposing the substrate surface to an aluminum-containing precursor gas to form a second substantially saturated layer of aluminum-containing precursor on the substrate surface;
   (d) exposing the substrate surface to a silicon-containing precursor gas to form the dielectric film; and
   (e) repeating (a)–(d) one or more times.

2. The method of claim 1, wherein (a) and (b) are repeated a plurality of cycles prior to (c) and (d) in at least some of the plurality of (a)–(d) cycles.

3. The method of claim of 1, wherein the substrate is a partially fabricated semiconductor wafer.

4. The method of claim of 1, wherein the phosphate-containing precursor gas comprises a precursor of the form:

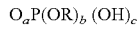

where
   a ∈ {0, 1}
   b ∈ {1, 2, 3}
   b+c=3
   R=alkyl or aromatic substitutent.

5. The method of claim of 1, wherein the phosphate-containing precursor gas is selected from the group consisting of di(iso-propyl)phosphate, bis(isopropyl)phosphate and bis(tertbutyl)phosphate, and combinations thereof.

6. The method of claim 1, wherein the phosphate-containing precursor gas comprises di(iso-propyl)phosphate.

7. The method of claim 1, wherein the silicon-containing precursor further comprises oxygen.

8. The method of claim 1, wherein the aluminum-containing precursor is at least one of hexakis(dimethylamino) aluminum and trimethyl aluminum.

9. The method of claim 1, wherein the silicon-containing precursor is at least one of a silanol and a silanediol.

10. The method of claim 1, wherein the silicon-containing precursor is at least one of tris(tert-butoxy)silanol $((C_4H_9O)_3SiOH)$ and tris(tert-pentoxy)silanol$((C_5H_{11}O)_3SiOH)$.

11. The method of claim 1, further comprising purging with an inert gas between exposures of precursor gas.

12. The method of claim 1, wherein operations (c) and (d) occur in the same deposition chamber.

13. The method of claim 1, wherein operations (c) and (d) occur in different deposition chambers in a multi-chamber apparatus.

14. The method of claim 1, further comprising exposing the substrate surface to one or more additional precursor gases.

15. The method of claim 1, further comprising a post-deposition treatment to remove water from the film.

16. The method of claim 1, wherein the resulting film is at least about 150 Angstroms thick.

17. The method of claim 1, wherein (a) and (b) are repeated a plurality of cycles prior to (c) and (d).

18. The method of claim 17, wherein the plurality is between 2 and 5.

19. The method of claim 1, wherein the substrate is a partially fabricated semiconductor wafer.

20. The method in claim 19, wherein the dielectric film is deposited over gaps in the partially fabricated semiconductor wafer.

21. A method of forming a dielectric film, the method comprising:
   (a) exposing a substrate surface to an metal-containing precursor gas to form a substantially saturated layer of metal-containing precursor on the substrate surface;
   (b) exposing the substrate surface to a phosphate-containing precursor gas to form metal phosphate on the substrate surface;
   (c) exposing the substrate surface to an metal-containing precursor gas to form a second substantially saturated layer of metal-containing precursor on the substrate surface;
   (d) exposing the substrate surface to a silicon-containing precursor gas to form the dielectric film; and
   (e) repeating (a)–(d) one or more times.

22. The method of claim 21, wherein (a) and (b) are repeated a plurality of cycles prior to (c) and (d) in at least some of the plurality of (a)–(d) cycles.

23. The method of claim 21, wherein the metal-containing precursor is selected from the list of metal-containing precursors comprising Zirconium, Hafnium, Gallium, Titanium, Niobium, and Tantalum.

24. The method of claim 21, wherein the resulting film is at least about 150 Angstroms thick.

25. The method of claim 21, wherein (a) and (b) are repeated a plurality of cycles prior to (c) and (d).

26. The method of claim 25, wherein the plurality is between 2 and 5.

* * * * *